(12) United States Patent
Gocho et al.

(10) Patent No.: US 9,559,030 B2
(45) Date of Patent: Jan. 31, 2017

(54) ELECTRONIC COMPONENT AND METHOD OF MANUFACTURING THE SAME

(71) Applicant: ALPS ELECTRIC CO., LTD., Ota-ku, Tokyo (JP)

(72) Inventors: Hideki Gocho, Tokyo (JP); Shuji Yanagi, Tokyo (JP); Masaya Yamatani, Tokyo (JP); Hisayuki Yazawa, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/068,761

(22) Filed: Mar. 14, 2016

(65) Prior Publication Data

US 2016/0284621 A1 Sep. 29, 2016

(30) Foreign Application Priority Data

Mar. 24, 2015 (JP) ................................. 2015-061656

(51) Int. Cl.

| | |
|---|---|
| *H01L 29/84* | (2006.01) |
| *H01L 23/31* | (2006.01) |
| *H01L 23/00* | (2006.01) |
| *H01L 21/56* | (2006.01) |
| *B81B 7/00* | (2006.01) |
| *B81C 1/00* | (2006.01) |

(52) U.S. Cl.
CPC ......... *H01L 23/3157* (2013.01); *B81B 7/0041* (2013.01); *B81B 7/0061* (2013.01); *B81C 1/00293* (2013.01); *B81C 1/00309* (2013.01); *H01L 21/563* (2013.01); *H01L 24/17* (2013.01); *B81B 2201/0214* (2013.01); *B81B 2201/0264* (2013.01); *H01L 2224/1713* (2013.01)

(58) Field of Classification Search
CPC .... H01L 23/3157; H01L 21/563; H01L 24/17; B81B 7/0041; B81B 7/0061; B81C 1/00293; B81C 1/00309
USPC .......................................................... 257/415
See application file for complete search history.

(56) References Cited

U.S. PATENT DOCUMENTS

| | | | |
|---|---|---|---|
| 8,269,300 B2 * | 9/2012 | Chien ............... | H01L 27/14618 257/431 |
| 8,791,532 B2 | 7/2014 | Graf et al. | |
| 2007/0215927 A1 | 9/2007 | Kuramochi | |

\* cited by examiner

*Primary Examiner* — Tu-Tu Ho
(74) *Attorney, Agent, or Firm* — Hunton & Williams LLP

(57) ABSTRACT

An electronic component has a circuit board with a main surface, a chip having a sensor facing the main surface, bump electrodes disposed between the main surface and the chip so as to be placed inside of the edges of the chip in a plan view of the main surface, a dam provided between the main surface and the chip so as to extend at least from the edges of the chip to outer positions of the bump electrodes in a plan view of the main surface, and an under-fill material provided at least in a clearance between the dam and the chip. Between the main surface and the sensor, a space is formed in a region enclosed by the bump electrodes in a plan view of the main surface. The under-fill material is disposed outside of the space in a plan view of the main surface.

12 Claims, 5 Drawing Sheets

ELECTRONIC COMPONENT AND METHOD OF MANUFACTURING THE SAME

CLAIM OF PRIORITY

This application contains subject matter related to and claims the benefit of Japanese Patent Application No. 2015-061656 filed on Mar. 24, 2015, the entire contents of which is incorporated herein by reference.

BACKGROUND OF THE DISCLOSURE

1. Field of the Invention

The present disclosure relates to an electronic component equipped with a chip component having a sensor part and a method of manufacturing the electronic component.

2. Description of the Related Art

When a chip component having a sensor part is mounted on a circuit board, it is necessary to leave a space around the sensor part during the mounting to prevent the functions of the sensor part from being impaired. Japanese Unexamined Patent Application Publication No. 2007-251070, for example, discloses a semiconductor device in which a dam is formed so as to enclose an inner region located inside of a connection region, in which connections between electrode terminals of a semiconductor element and pads on a circuit board are present, so that the inner region and connection region are separated from each other. In this semiconductor device, a plurality of through-holes extending through the circuit board are formed in the inner region, enclosed by the dam, on the circuit board to prevent bubbles from remaining in an under-fill material used for sealing.

U.S. Pat. No. 8,791,532 discloses a sensor assembly equipped with a sensor chip disposed so as to face a circuit board. In this assembly, a chamber is provided between the circuit board and the sensor chip. The chamber is enclosed by the dam so that the dam prevents the under-fill material from entering the chamber.

When a space around a sensor part is enclosed by a dam member, it is possible, to a certain extent, to prevent an under-fill material from entering the space. However, when the under-fill material is applied, it may leak from a clearance between the dam member and the chip component toward the inside space. Particularly, when an under-fill material with low viscosity is used, the under-fill material easily enters the inside space due to a capillary phenomenon. This is problematic in that it is difficult to control an amount by which the under-fill material is applied.

These and other drawbacks exist.

SUMMARY OF THE DISCLOSURE

Various embodiments of the present disclosure provide an electronic component that can reliably prevent an under-fill material from entering a space below a sensor part and a method of manufacturing the electronic component.

To solve the above problem, an electronic component according to the various embodiments has a circuit board having a main surface, a chip component having a sensor part disposed so as to face the main surface, a plurality of bump electrodes disposed between the main surface and the chip component so as to be placed inside of the edges of the chip component in a plan view of the main surface, a dam member provided between the main surface and the chip component so as to extend at least from the edges of the chip component to the outer positions of the plurality of bump electrodes in a plan view of the main surface, and an under-fill material provided at least in a clearance between the dam member and the chip component. A space is formed in a region enclosed by the plurality of bump electrodes in a plan view of the main surface, the space being between the main surface and the sensor part. The under-fill material is disposed outside of the space in a plan view of the main surface.

In this structure, a region in which the dam member is not present is formed between the inner edges of the dam member and the space below the sensor part. Thus, when the under-fill material is applied, it intrudes through a small clearance between the dam member and the chip component, but the under-fill material does not reach the space, below the sensor part, which is located inside of the region. Therefore, it is possible to prevent the under-fill material from reaching the space below the sensor part.

With the electronic component in the present disclosure, a clearance between the dam member and the chip component may be narrower than another clearance between the main surface and the chip component, the other clearance being present between the dam member and the space. In this structure, it is possible to suppress an amount by which the under-fill material intrudes through the clearance between the dam member and the chip component and to reliably form a region, between the inner edges of the dam member and the space below the sensor part, in which the dam member is not present.

With the electronic component in the present disclosure, the clearance between the dam member and the chip component may be increased gradually, starting from the same side as the outside of the chip component toward the same side as the inside of the chip component. In this structure, since the clearance between the dam member and the chip component is increased gradually in a path, in the clearance, through which the under-fill material intrudes, it is possible to stop the intrusion of the under-fill member before it reaches the space below the chip component.

With the electronic component in the present disclosure, the outer edges of the dam member may be positioned outside of the edges of the chip component in a plan view of the main surface. In this structure, although the under-fill material intrudes from the same side as the outside of the chip component toward the same side as the inside of the chip component, it is possible to prevent the under-fill material from reaching the space below the sensor part.

With the electronic component in the present disclosure, the sensor part may have a humidity sensor that has a moisture sensitive film, a dielectric constant of the moisture sensitive film changing according to an amount of moisture that has flowed from the outside into the space. With the electronic component in the present disclosure, the sensor part may also have a movable part. In this structure, it is possible to reliably allocate a space in which the humidity sensor and movable part in the sensor part operate.

A method of manufacturing an electronic component according to the present disclosure includes, a dam forming step of forming a dam member on the main surface of a circuit board, a mounting step of mounting a chip component on the circuit board, the chip component having a sensor part, the chip component and the circuit board being mutually connected through a plurality of bump electrodes in a state in which the sensor part and the main surface face each other and a space is left between the sensor part and the main surface, and a fill applying step of applying an under-fill material at least between the dam member and the chip component. In the dam forming step, the dam member is disposed between the circuit board and the chip component so as to extend at least from the edges of the chip component to the outer positions of the plurality of bump electrodes in a plan view of the main surface.

In this structure, a region in which the dam member is not present is formed between the inner edges of the dam member and the space below the sensor part. Thus, although the under-fill material intrudes through a small clearance between the dam member and the chip component in the fill-applying step, the under-fill material does not reach the space, below the sensor part, which is located inside of the region. Therefore, it is possible to prevent the under-fill material from reaching the space below the sensor part.

In the method of manufacturing an electronic component according to the present disclosure, in the dam forming step, the dam member may be formed so that a clearance between the dam member and the chip component is narrower than another clearance between the main surface and the chip component, the other clearance being present between the dam member and the space. In this structure, it is possible to reliably form a region, between the inner edges of the dam member and the space below the sensor part, in which the dam member is not present.

In the method of manufacturing an electronic component according to the present disclosure, in the dam forming step, the dam may be formed so that the clearance between the dam member and the chip component is increased gradually, starting from the same side as the outside of the chip component toward the same side as the inside of the chip component. In this structure, since the clearance between the dam member and the chip component is increased gradually in a path, in the clearance, through which the under-fill material intrudes, it is possible to stop the intrusion of the under-fill member before it reaches the space below the chip component.

In the method of manufacturing an electronic component according to the present disclosure, in the dam forming step, the outer edges of the dam member may be positioned outside of the edges of the chip component in a plan view of the main surface. In this structure, although the under-fill material intrudes from the same side as the outside of the chip component toward the same side as the inside of the chip component, it is possible to prevent the under-fill material from reaching the space below the sensor part.

In the method of manufacturing an electronic component according to the present disclosure, the sensor part may have a humidity sensor that has a moisture sensitive film, a dielectric constant of the moisture sensitive film changing according to an amount of moisture that has flowed from the outside into the space. In the method of manufacturing an electronic component according to the present disclosure, the sensor part may also have a movable part. In this structure, it is possible to reliably allocate a space in which the humidity sensor and movable part in the sensor part operate.

DETAILED DESCRIPTION OF THE DISCLOSURE

Figure 1A:
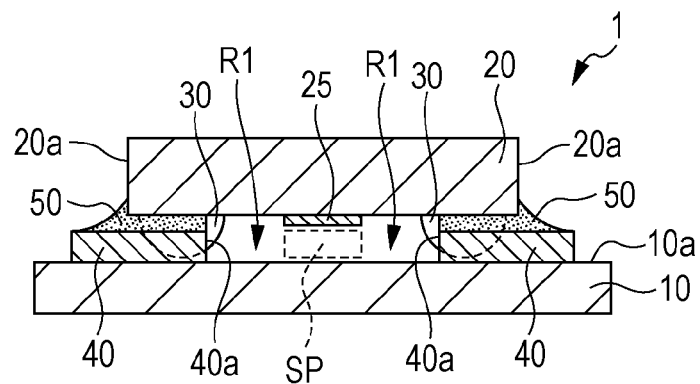
FIGS. 1A and 1B schematically illustrate an electronic component according to an example embodiment of the disclosure.

The following description is intended to convey a thorough understanding of the embodiments described by providing a number of specific embodiments and details involving an electronic component and method of manufacturing the same. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Example embodiments of the present disclosure will be described below with reference to the drawings. In the descriptions below, like elements will be denoted by like reference characters and repeated descriptions of members will be omitted.

Figure 1B:
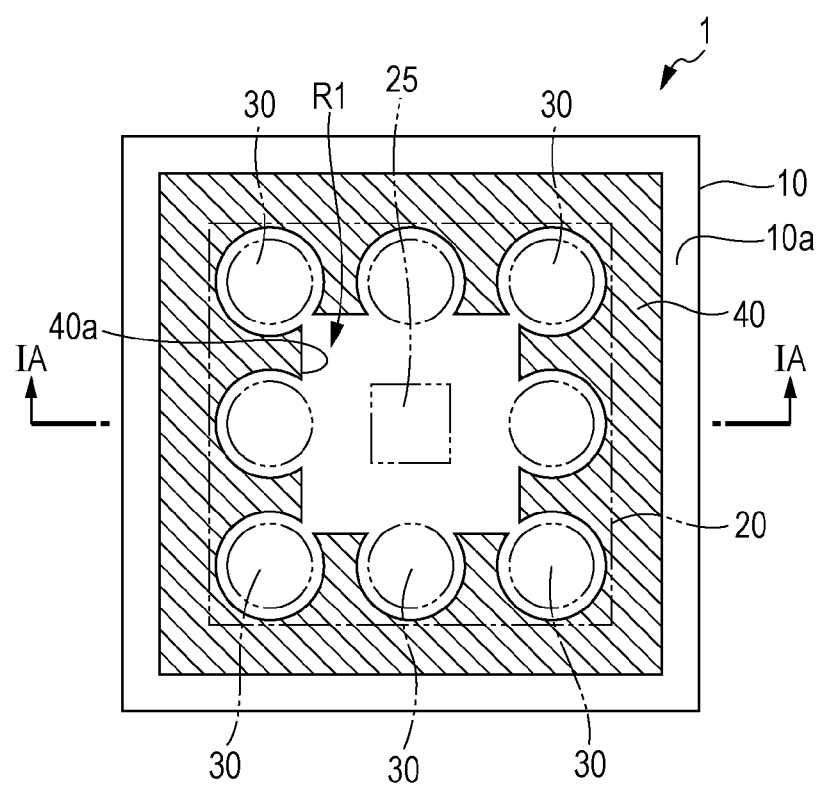

FIGS. 1A and 1B schematically illustrate an electronic component according to an example embodiment of the disclosure.

FIG. 1A is a cross-sectional view of an electronic component 1 according to this embodiment, and FIG. 1B is a plan view of the electronic component 1 according to this embodiment. The cross-sectional view in FIG. 1A is taken along line IA-IA in FIG. 1B. In FIG. 1B, for convenience of explanation, a chip component 20 and a sensor part 25 are represented by dash-dot-dot lines, and an under-fill material 50 is not illustrated.

Figure 2:
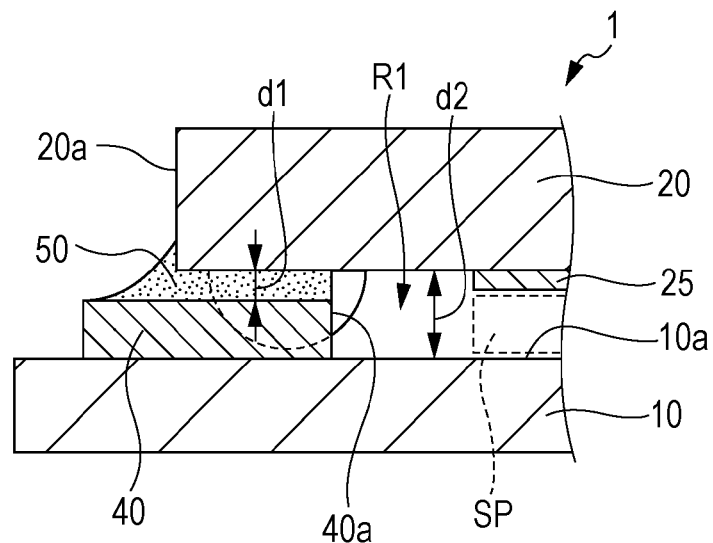
FIG. 2 is an enlarged cross-sectional view that schematically illustrates part of a dam member according to an example embodiment of the disclosure.
Figure 3:
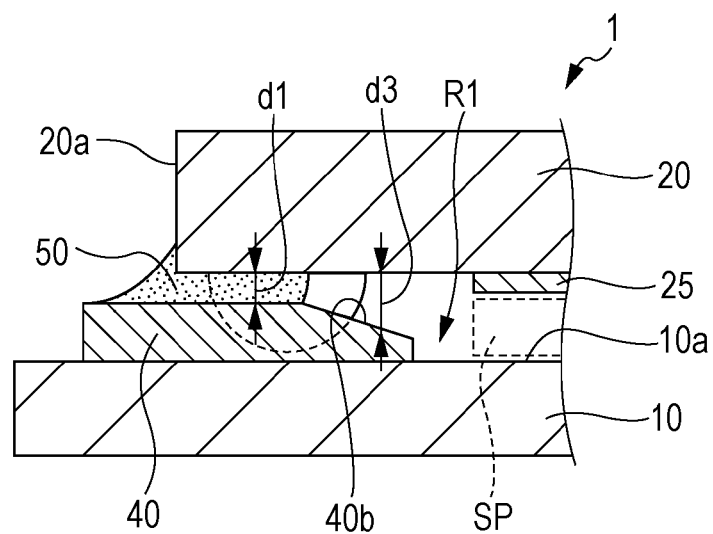
FIG. 3 is also an enlarged cross-sectional view that schematically illustrates part of the dam member according to an example embodiment of the disclosure.

FIGS. 2 and 3 are each an enlarged cross-sectional view that schematically illustrates part of a dam member according to this example embodiment.

The electronic component 1 according to this embodiment may include a circuit board 10, the chip component 20, bump electrodes 30, a dam member 40, and the under-fill material 50. The circuit board 10 may be a base material on which to mount the chip component 20. A printed wiring board or a ceramic circuit board may be used as the circuit board 10. The circuit board 10 may have a main surface 10a. The chip component 20 may be mounted on the main surface 10a of the circuit board 10.

The chip component 20 may be, for example, a component obtained by dividing a semiconductor wafer into segments in a rectangular shape. Certain elements and circuits may have been formed on the chip component 20. The chip component 20 may include the sensor part 25. The sensor part 25 may be formed on a surface of the chip component 20.

The sensor part 25 may have a function that converts a state around the sensor part 25 or a change in the state into an electric signal. The sensor part 25 may detect, for example, temperature, humidity, pressure, or magnetic force around the sensor part 25. The sensor part 25 may have a movable part. The sensor part 25 may be, for example, a Micro-electronic-mechanical Systems (MEMS). A diaphragm having a comb-shaped electrode and a resistive element, for example, may be attached to the movable part of the sensor part 25.

The chip component 20 may be placed in a state in which a space SP is left between the sensor part 25 and the main surface 10*a* of the circuit board 10. That is, the sensor part 25 and main surface 10*a* may face each other with the predetermined space SP intervening between them. Due to the presence of the space SP, the sensor part 25 can detect a state around the sensor part 25 or a change in the state.

The bump electrodes 30 may be disposed between the main surface 10*a* and the chip component 20. Each bump electrode 30 may be used to provide an electric connection between the chip component 20 and a pad electrode (not illustrated) on the circuit board 10 and to mechanically support the chip component 20. A plurality of bump electrodes 30 may be placed between the main surface 10*a* and the chip component 20 and inside of the edges 20*a* of the chip component 20, in a plan view of the main surface 10*a*. Accordingly, the height of the space SP is set according to the height of the bump electrode 30. Gold or a solder may be used as the bump electrode 30.

The dam member 40 may be disposed between the main surface 10*a* and the chip component 20. The dam member 40 may extend at least from the edges 20*a* of the chip component 20 to the outer positions of the plurality of bump electrodes 30 in a plan view of the main surface 10*a*. The outer circumferential portion of the dam member 40 encloses the outer sides of the plurality of bump electrodes 30. In this embodiment, the dam member 40 may extend from the outer sides of the edges 20*a* of the chip component 20 to positions a little short of the inner sides of the bump electrodes 30.

The under-fill material 50 may be disposed outside of the space SP and at least between the dam member 40 and the chip component 20 in a plan view of the main surface 10*a*.

In the electronic component 1 in this embodiment described above, a first region R1, in which the dam member 40 is not present, is formed between the inner edges 40*a* of the dam member 40 and the space SP below the sensor part 25. In the example in FIGS. 1A and 1B, the first region R1 is formed between the chip component 20 and the main surface 10*a* and between the outer sides of the space SP and the inner edges 40*a* of the dam member 40, the first region R1 being continuous to the space SP. Since the first region R1 is formed in this way, it is possible to prevent the under-fill material 50 to enter the space SP.

With the electronic component 1 according to this embodiment, the dam member 40 has a closed shape in a plan view of the main surface 10*a*, so the sensor part 25 is less likely to be affected by the outside environment. Therefore, the sensor part 25 in the electronic component 1 may be used in a case in which a sensor part has a detection function the detection precision of which is likely to be impaired by physical quantities of other than a target to be detected (such as a function to detect magnetism or acceleration).

With the electronic component 1 according to this embodiment, a clearance d1 between the dam member 40 and the chip component 20 may be narrower than a clearance d2 between the main surface 10*a* and the chip component 20, the clearance d2 being present between the dam member 40 and the space SP, as illustrated in FIG. 2. Thus, the first region R1 continuous to the space SP may be formed between the dam member 40 and the space SP. When the under-fill material 50 is applied, it enters the inside through the clearance d1 between the dam member 40 and the chip component 20. Since there is the first region R1, however, the under-fill material 50 is stopped in the first region R1.

That is, the under-fill material 50 enters the inside through the clearance d1 between the dam member 40 and the chip component 20 due to a capillary phenomenon. Since an angle of contact between the under-fill material 50 and the surface of the dam member 40 is increased in the first region R1 (for example, the angle becomes approximately 180 degrees or more), however, the movement of the under-fill material 50 due to the capillary phenomenon is suppressed. The lower the viscosity of the under-fill material 50 is, the more noticeable the effect of suppressing the movement of the under-fill material 50 is.

An inclined surface 40*b* may be formed at part of the dam member 40 on the same side as the space SP, as illustrated in FIG. 3. On the inclined surface 40*b*, a clearance d3 between the dam member 40 and the chip component 20 may be increased gradually, starting from the outside toward the inside. In this structure, therefore, the clearance d3 between the dam member 40 and the chip component 20 is increased gradually in a path through which the under-fill material 50 intrudes, and the movement of the under-fill material 50 due to the capillary phenomenon is weakened gradually. Therefore, it is possible to stop the intrusion of the under-fill material 50 before it reaches the space SP.

The gradual increase of the clearance d3 is not limited to a case in which the clearance d3 is continuously increased by the inclined surface 40*b*, an inclined curved-surface, or the like; the clearance d3 may be increased step by step by stepped surfaces.

FIGS. 4A to 4D are cross-sectional views that schematically illustrate a method of manufacturing the electronic component according to an example embodiment of the disclosure.

Figure 4A:
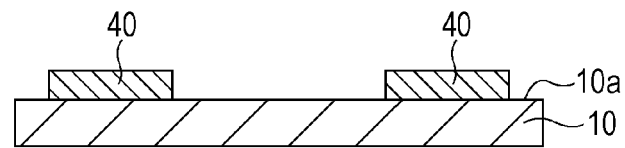
FIGS. 4A to 4D are cross-sectional views that schematically illustrate a method of manufacturing the electronic component according to an example embodiment of the disclosure.
Figure 4B:
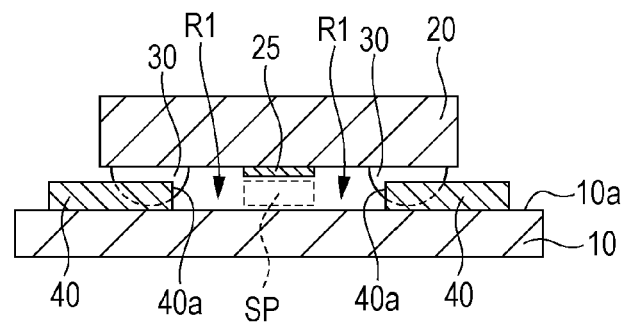

First, the dam member 40 may be formed on the main surface 10*a* of the circuit board 10 as illustrated in FIG. 4A (dam forming step). Then the chip component 20 may be mounted on the main surface 10*a* of the circuit board 10 so that the sensor part 25 of the chip component 20 may face the main surface 10*a* as illustrated in FIG. 4B (mounting step). This mounting is so-called face-down mounting. Bump electrodes 30 may be provided in advance on the chip component 20 or the circuit board 10. The chip component 20 may be mounted on the circuit board 10 with the bump electrodes 30 intervening between them. The space SP may be formed between the sensor part 25 and the main surface 10*a*.

Figure 4C:
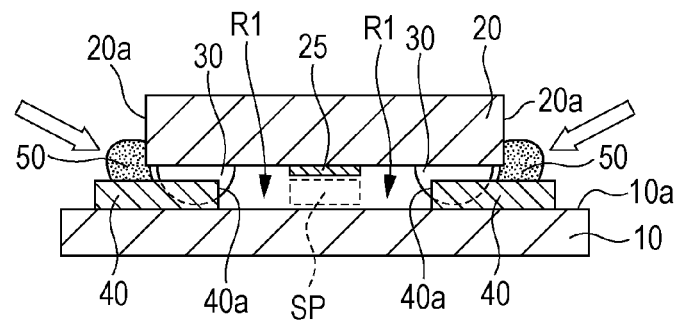
Figure 4D:
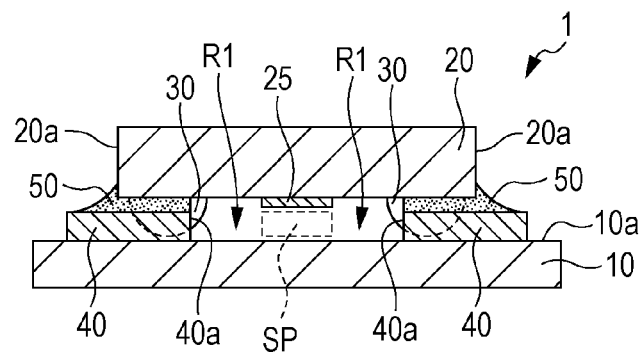

Next, the under-fill material 50 may be applied as illustrated in FIG. 4C (applying step). The under-fill material 50 may be, for example, a thermosetting resin. The under-fill material 50 may be applied in a state in which it has yet to be cured and its viscosity is thereby low. When the under-fill material 50 is applied from the outside of the chip component 20, the under-fill material 50 enters the clearance between the chip component 20 and the dam member 40 due to a capillary phenomenon.

In this embodiment, when the under-fill material 50 is applied by a predetermined amount, at least the clearance between the chip component 20 and the dam member 40 is filled with the under-fill material 50. The under-fill material 50 may protrude from the edges 20*a* of the chip component 20 toward the outside. However, the under-fill material 50 does not enter the space SP between the sensor part 25 and the main surface 10*a*. Although the under-fill material 50 intrudes from the outside toward the inside, the under-fill material 50 stops in the first region R1 formed between the dam member 40 and the space SP, preventing the under-fill material 50 from entering the space SP. Although part of the under-fill material 50 may enter the first region R1 a little, the under-fill material 50 does not reach the space SP.

After the under-fill material 50 has been applied, it may be cured by predetermined curing or the like, completing the electronic component 1. In this manufacturing method, the space SP is not filled with the under-fill material 50, so it is possible to use the under-fill material 50 for sealing without impairing the functions of the sensor part 25.

Figure 5A:
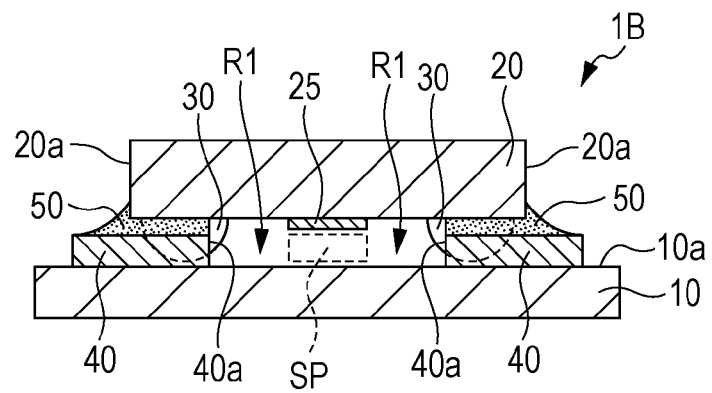
FIGS. 5A and 5B schematically illustrate a modification according to an example embodiment of the disclosure.
Figure 5B:
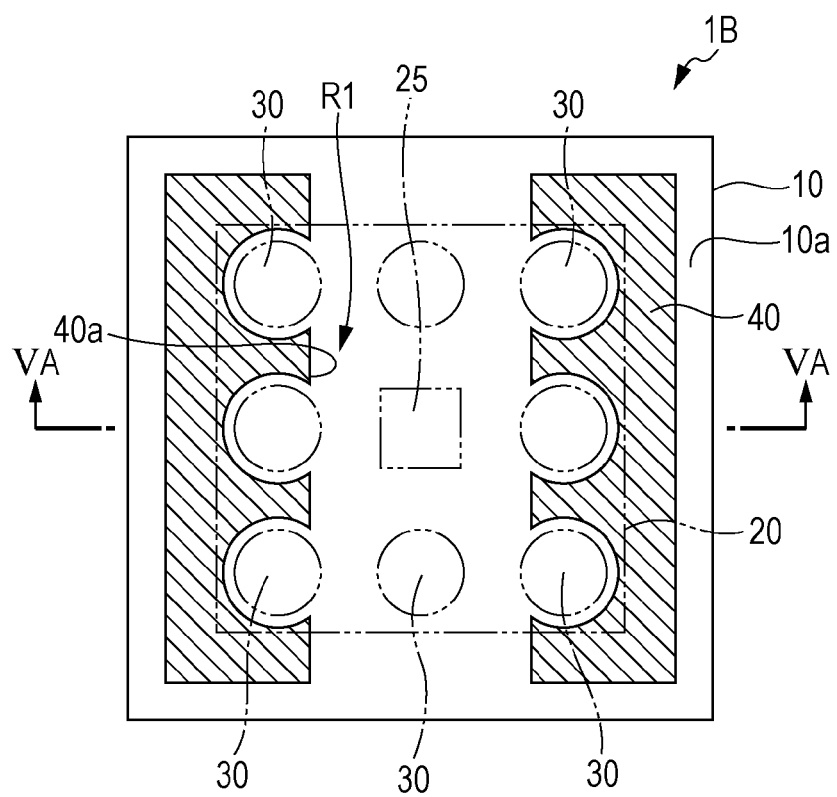

FIG. 5A is a cross-sectional view of an electronic component 1B in a modification according to an example embodiment of the disclosure, and FIG. 5B is a plan view of the electronic component 1B in the modification. The cross-sectional view in FIG. 5A is taken along line VA-VA in FIG. 5B. In FIG. 5B, for convenience of explanation, the chip component 20 and sensor part 25 are represented by dash-dot-dot lines, and the under-fill material 50 is not illustrated.

The electronic component 1B in the modification, the dam member 40 is divided. That is, the dam member 40 does not have a closed shape in a plan view of the main surface 10a. Therefore, the space SP communicates with an outside space at portions at which the dam member 40 is not present.

When the dam member 40 of this type is used, the under-fill material 50 is applied from the outside of portions at which the dam member 40 is present. That is, the under-fill material 50 is not applied from the portions at which the dam member 40 is not present. This can prevent the under-fill material 50 from entering the space SP.

Since the space SP in the electronic component 1B in the modification communicates with the space outside of the dam member 40, changes in humidity and pressure in the outside can be easily detected in the space SP. Therefore, the sensor part 25 in the electronic component 1B may be as a sensor having a detection function that may be to precisely detect changes in the outside environment. Specific examples of the sensor part 25 of this type include a humidity sensor that has a moisture sensitive film the dielectric constant of which changes according to the amount of moisture that has flowed from the outside into the space SP.

Figure 6A:
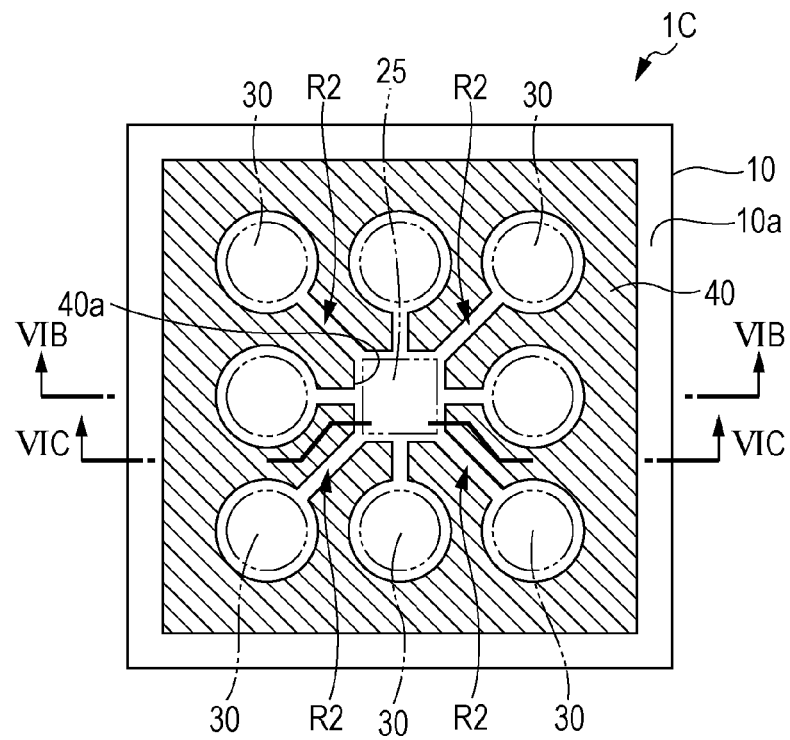
FIGS. 6A to 6C schematically illustrate an electronic component according to an example embodiment of the disclosure.
Figure 6B:
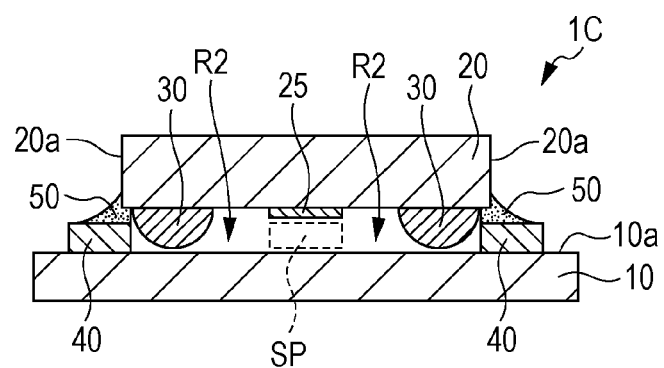
Figure 6C:
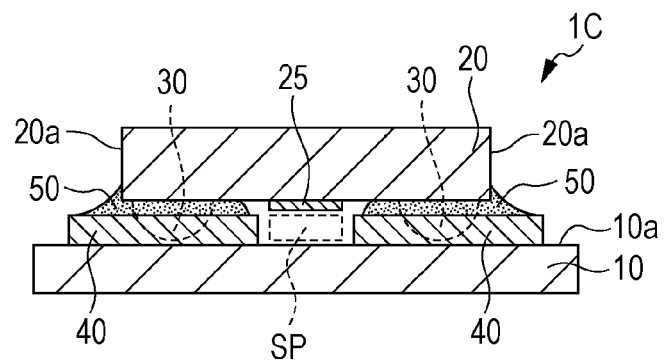

FIGS. 6A to 6C schematically illustrate an electronic component according to a an example embodiment of the disclosure.

FIG. 6A is a plan view of an electronic component 1C according to this embodiment. FIG. 6B is a cross-sectional view taken along line VIB-VIB in FIG. 6A. FIG. 6C is a cross-sectional view taken along line VIC-VIC in FIG. 6A.

With the electronic component 1C according to this embodiment, the inner edges 40a of the dam member 40 may extend to the space SP beyond the inner sides of the bump electrodes 30. For example, the inner edges 40a may be provided up to positions at which the inner edges 40a are adjacent to the space SP. In this embodiment, second regions R2, which communicate with the space SP, are formed. In each second region R2, the dam member 40 is not disposed. For example, the dam member 40 is not formed in portions at which the bump electrodes 30 are disposed. The second region R2 extends from the space SP to a portion at which one bump electrode 30 is disposed.

Thus, when the under-fill material 50 is applied, it intrudes through a small clearance between the dam member 40 and the chip component 20, but the under-fill material 50 is stopped in the second regions R2. That is, it is possible to stop the intrusion of the under-fill material 50 in the second region R2 and prevent the under-fill material 50 from reaching the space SP.

With the electronic component 1C in this embodiment, it is possible to use the under-fill material 50 for sealing with the space SP allocated and to enclose a wide region located outside of the space SP with the dam member 40.

As described above, the embodiments can provide the electronic components 1, 1B, and 1C that can reliably prevent the under-fill material 50 from entering the space SP below the sensor part 25 and can also provide a method of manufacturing the electronic components 1, 1B, and 1C.

So far, embodiments of the present disclosure have been described. However, the present invention is not limited to examples in these embodiments. For example, the scope of the present invention includes embodiments obtained as a result of making additions or deletions of constituent element to or from the above embodiments, performing design changes to the above embodiments, or combining features in examples in the above embodiments; the additions or deletions, the design changes, or the combination is appropriately effected by a person having ordinary skill in the art without departing from the intended scope of the invention.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. An electronic component comprising:
   a circuit board having a main surface;
   a chip component having a sensor part disposed so as to face the main surface;
   a plurality of bump electrodes disposed between the main surface and the chip component so as to be placed inside of an edge of the chip component in a plan view of the main surface;
   a dam member provided between the main surface and the chip component so as to extend at least from the edge of the chip component to outer positions of the plurality of bump electrodes in a plan view of the main surface; and
   an under-fill material provided at least in a clearance between the dam member and the chip component; wherein
   a space is formed in a region enclosed by the plurality of bump electrodes in a plan view of the main surface, the space being between the main surface and the sensor part, and
   the under-fill material is disposed outside of the space in a plan view of the main surface.

2. The electronic component according to claim 1, wherein a first clearance between the dam member and the chip component is narrower than a second clearance between the main surface and the chip component, the second clearance being present between the dam member and the space.

3. The electronic component according to claim 1, wherein the first clearance between the dam member and the chip component is increased gradually, starting from a same side as an outside of the chip component toward a same side as an inside of the chip component.

4. The electronic component according to claim 1, wherein an outer edge of the dam member is positioned outside of the edge of the chip component in a plan view of the main surface.

5. The electronic component according to claim 1, wherein the sensor part has a humidity sensor that has a moisture sensitive film, a dielectric constant of the moisture sensitive film changing according to an amount of moisture that has flowed from an outside into the space.

6. The electronic component according to claim 1, wherein the sensor part has a movable part.

7. A method of manufacturing an electronic component, the method comprising:
   a dam forming step of forming a dam member on a main surface of a circuit board;
   a mounting step of mounting a chip component on the circuit board, the chip component having a sensor part, the chip component and the circuit board being mutually connected through a plurality of bump electrodes in a state in which the sensor part and the main surface face each other and a space is left between the sensor part and the main surface; and
   a fill applying step of applying an under-fill material at least between the dam member and the chip component; wherein
   in the dam forming step, the dam member is disposed between the circuit board and the chip component so as to extend at least from an edge of the chip component to outer positions of the plurality of bump electrodes in a plan view of the main surface.

8. The method according to claim 7, wherein in the dam forming step, the dam is formed so that a first clearance between the dam member and the chip component is narrower than a second clearance between the main surface and the chip component, the second clearance being present between the dam member and the space.

9. The method according to claim 7, wherein in the dam forming step, the dam is formed so that the first clearance between the dam member and the chip component is increased gradually, starting from a same side as an outside of the chip component toward a same side as an inside of the chip component.

10. The method according to claim 7, wherein in the dam forming step, the dam is formed so that an outer edge of the dam member is positioned outside of the edge of the chip component in a plan view of the main surface.

11. The method according to claim 7, wherein the sensor part has a humidity sensor that has a moisture sensitive film, a dielectric constant of the moisture sensitive film changing according to an amount of moisture that has flowed from an outside into the space.

12. The method according to claim 7, wherein the sensor part has a movable part.

* * * * *